United States Patent
Kong et al.

(10) Patent No.: US 12,068,258 B2
(45) Date of Patent: Aug. 20, 2024

(54) METHOD FOR FABRICATING ELECTRONIC ASSEMBLY INCLUDING A MAGNETIC FIELD SHIELDING FILM

(71) Applicant: 3M INNOVATIVE PROPERTIES COMPANY, St. Paul, MN (US)

(72) Inventors: Jiwoong Kong, Gyeonggi-do (KR); Jung Ju Suh, Seoul (KR); Seong-Woo Woo, Gyeonggi-do (KR)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 198 days.

(21) Appl. No.: 17/737,285

(22) Filed: May 5, 2022

(65) Prior Publication Data
US 2022/0262740 A1   Aug. 18, 2022

Related U.S. Application Data

(63) Continuation of application No. 17/249,559, filed on Mar. 5, 2021, now Pat. No. 11,355,453, which is a
(Continued)

(30) Foreign Application Priority Data

Mar. 22, 2019   (KR) .................. 10-2019-0033151

(51) Int. Cl.
    H01L 23/552    (2006.01)
    H01L 21/50     (2006.01)
    H05K 9/00      (2006.01)
(52) U.S. Cl.
    CPC ............ *H01L 23/552* (2013.01); *H01L 21/50* (2013.01); *H05K 9/0026* (2013.01)
(58) Field of Classification Search
    CPC .............................. H01L 23/552; H01L 21/50
    (Continued)

(56) References Cited

U.S. PATENT DOCUMENTS

| 7,576,415 B2 | 8/2009 | Cha |
| 9,345,184 B2 | 5/2016 | Oster |

(Continued)

FOREIGN PATENT DOCUMENTS

| JP | 2007-295557 | 11/2007 |
| JP | 2014-240516 | 12/2014 |

(Continued)

*Primary Examiner* — Quoc D Hoang
(74) *Attorney, Agent, or Firm* — Robert S. Moshrefzadeh

(57) ABSTRACT

An electronic assembly according to an embodiment includes: a circuit board including a first edge surface and a trace having an electrical conductivity; an electronic element including a lateral edge spatially spaced apart from the first edge surface, and mounted on the circuit board and electrically connected to the trace; a protection layer including a second edge surface and disposed on the electronic element to substantially cover the electronic element; a magnetic field shielding film including a third edge surface and disposed on the protection layer; and a first metal layer. The first edge surface connects a main top surface of the circuit board and a main bottom surface of the circuit board, the second edge surface connects a main top surface of the protection layer and a main bottom surface of the protection layer, and the third edge surface connects a main top surface of the magnetic field shielding film and a main bottom surface of the magnetic field shielding film, and the first edge surface, the second edge surface, and the third edge surface are substantially aligned with one another to form a coupling edge surface which is substantially planar. In addition, the first metal layer is disposed on the magnetic field shielding film, and covers the main top surface of the magnetic field shielding film and the coupling edge surface.

20 Claims, 8 Drawing Sheets

Related U.S. Application Data continuation of application No. 16/822,145, filed on Mar. 18, 2020, now Pat. No. 10,985,111.

(58) Field of Classification Search
USPC .................................................. 257/552, 659
See application file for complete search history.

(56) References Cited

U.S. PATENT DOCUMENTS

| | | | |
|---|---|---|---|
| 9,974,215 | B1 | 5/2018 | Jeong |
| 10,388,611 | B2 | 8/2019 | Cho |
| 2004/0000415 | A1 | 1/2004 | Rizzo et al. |
| 2013/0082368 | A1 | 4/2013 | Kim |
| 2014/0239465 | A1* | 8/2014 | Yen .......................... H01L 24/97 |
| | | | 257/659 |
| 2015/0123604 | A1 | 5/2015 | Lee et al. |
| 2015/0179588 | A1 | 6/2015 | Choi |
| 2016/0057900 | A1 | 2/2016 | Polak et al. |
| 2017/0278804 | A1* | 9/2017 | Kawabata ............. H01L 23/552 |
| 2018/0240758 | A1 | 8/2018 | Okamoto et al. |
| 2018/0261550 | A1* | 9/2018 | Cho ...................... H01L 23/552 |
| 2018/0359885 | A1 | 12/2018 | Woo |
| 2019/0044391 | A1 | 2/2019 | Jang et al. |
| 2019/0148988 | A1 | 5/2019 | Hwang et al. |
| 2019/0206804 | A1 | 7/2019 | Jung et al. |

FOREIGN PATENT DOCUMENTS

| | | |
|---|---|---|
| JP | 2015-126230 | 7/2015 |
| KR | 1020160048691 | 5/2016 |
| KR | 101939653 | 1/2019 |

* cited by examiner

METHOD FOR FABRICATING ELECTRONIC ASSEMBLY INCLUDING A MAGNETIC FIELD SHIELDING FILM

CROSS REFERENCE TO RELATED APPLICATION

This application is a continuation filing of U.S. application Ser. No. 17/249,559, filed Mar. 5, 2021, now allowed, which is a continuation filing of U.S. application Ser. No. 16/822,145, filed Mar. 18, 2020, issued as U.S. Pat. No. 10,985,111, which claims the benefit of Korean Application No. 10-2019-0033151, filed Mar. 22, 2019, the disclosures of which are incorporated by reference in their entireties herein.

BACKGROUND

Technical Field

The present disclosure relates to an electronic assembly, an electronic apparatus including the same, and a method for fabricating an electronic assembly.

Background Art

Electromagnetic waves are normally generated in electronic products. Electromagnetic waves refer to propagation of waves in which an electric field and a magnetic field are combined.

The electric field constituting electromagnetic waves may be easily blocked by using a conductor. For example, the electric field may be blocked by grounding the roof, wall surface, floor, etc. of a building to the ground or by using a shielding material such as grounded aluminum.

However, in the case of the magnetic field constituting electromagnetic waves, a special material having high permeability should be used to block. Such a magnetic field is harmful to human body, and may cause noises or malfunction to industrial and home devices.

Accordingly, harmfulness of electromagnetic waves is recognized and much effort is made in all countries of the world to prevent malfunction of devices caused by electromagnetic waves and to protect users from harmful environments by setting standards of electro magnetic interference (EMI) and electro magnetic susceptibility (EMS).

PRIOR DOCUMENTS

Patent Document (Patent Document 1) Korean Patent Registered Publication No. 10-1939653 (published on Jan. 11, 2019).

SUMMARY

Technical Problem

An object to be achieved by the present disclosure is to provide an electronic assembly having the capability of shielding from an electromagnetic field, and an electronic apparatus including the electronic assembly.

In addition, an object of the present disclosure is to provide a method for fabricating the above-described electronic assembly.

The objects to be achieved by the present disclosure are not limited to those mentioned above, and other objects that are not mentioned above may be clearly understood to those skilled in the art based on the description provided below.

Technical Solution

An electronic assembly according to a first embodiment includes: a circuit board including a first edge surface and a trace having an electrical conductivity; an electronic element including a lateral edge spatially spaced apart from the first edge surface, and mounted on the circuit board and electrically connected to the trace; a protection layer including a second edge surface and disposed on the electronic element to substantially cover the electronic element; a magnetic field shielding film including a third edge surface and disposed on the protection layer; and a first metal layer. Herein, the first edge surface connects a main top surface of the circuit board and a main bottom surface of the circuit board, the second edge surface connects a main top surface of the protection layer and a main bottom surface of the protection layer, and the third edge surface connects a main top surface of the magnetic field shielding film and a main bottom surface of the magnetic field shielding film, and the first edge surface, the second edge surface, and the third edge surface are substantially aligned with one another to form a coupling edge surface which is substantially planar. In addition, the first metal layer is disposed on the magnetic field shielding film, and covers the main top surface of the magnetic field shielding film and the coupling edge surface.

An electronic assembly according to a second embodiment includes: a board; a plurality of semiconductor integrated circuits which are spatially spaced apart from one another and are mounted on the board; and a nanocrystalline soft magnetic film to shield the integrated circuits; and a first metal edge surface which connects a main top surface of the nanocrystalline soft magnetic film and a main bottom surface of the electronic assembly, and is substantially planar, and the first metal edge surface includes a first regular pattern including first features which are substantially parallel to one another.

An electronic assembly according to a third embodiment includes: a board; at least one semiconductor integrated circuit mounted on the board; a nanocrystalline soft magnetic film to shield the at least one integrated circuit; and a first metal edge surface and a second metal edge surface which connect a main top surface of the nanocrystalline soft magnetic film and a main bottom surface of the electronic assembly, respectively, and are substantially planar, and each of the first metal edge surface and the second metal edge surface includes any one of a first pattern and a second pattern, and the first pattern has first Fourier transform having a first peak, and the second pattern has second Fourier transform having a second peak.

An electronic assembly according to a fourth embodiment includes: a board including a plurality of traces having an electrical conductivity; a plurality of semiconductor integrated circuits which are spatially spaced apart from one another and are mounted on a first main surface of the board, and are electrically connected with the plurality of traces; a first metal film which is disposed on the plurality of integrated circuits; and a magnetic field shielding layer which is disposed between the first metal film and the plurality of integrated circuits, and the magnetic field shielding layer and the first metal film cover the plurality of integrated circuits, respectively, and the first metal film is extended over edges of the electronic assembly toward the first main surface of the board to cover the plurality of integrated circuits at least partially, and physically contacts lateral edges of the first main surface of the board.

A method for fabricating an electronic assembly according to a fifth embodiment includes: providing a board including a plurality of traces having an electrical conductivity, and at least two spatially spaced semiconductor integrated circuits which are mounted on a first main surface of the board and are electrically connected with the plurality of traces; disposing a protection layer on the at least two spatially spaced integrated circuits; forming a multilayer article by disposing a magnetic field shielding film on a main top surface of the protection layer; producing at least two cut multilayer articles by cutting the multilayer article along a thickness direction of the multilayer article at a predetermined cutting point between the at least two spatially spaced integrated circuits, each of the cut multilayer articles including a cut multilayer edge surface including exposed edges of the board, the protection layer, and the magnetic field shielding film at the predetermined cutting point; and with respect to at least one of the cut multilayer articles, fabricating the electronic assembly by disposing a first metal layer at least on a main top surface and the cut multilayer edge surface of the at least one cut multilayer article.

An electronic assembly according to a sixth embodiment includes: a circuit board including a ground layer disposed therein and having an electrical conductivity, and including a trace having an electrical conductivity; a semiconductor integrated circuit mounted on the circuit board and electrically connected with the trace; a protection layer disposed on the integrated circuit board to substantially cover the integrated circuit; a first metal film disposed on the protection layer to substantially cover the integrated circuit; and a magnetic field shielding film disposed between the first metal film and the protection layer, and the first metal film is extended over an edge of the electronic assembly toward a first main surface of the circuit board, and physically contacts a lateral edge of the ground layer.

An electronic assembly according to a seventh embodiment includes: a circuit board including a trace having an electrical conductivity; a semiconductor integrated circuit mounted on the circuit board and electrically connected with the trace; a protection layer substantially electrically insulative and disposed on the integrated circuit; a first metal film disposed on the protection layer; a magnetic field shielding film disposed between the first metal film and the protection layer; and a polymeric layer which is substantially opaque from an optical aspect and is laser-writable, and is disposed between the first metal film and the magnetic field shielding film, and the protection layer, the first metal film, the magnetic field shielding film, and the polymeric layer are co-extensive with the circuit board in length and width.

Advantageous Effects

According to an embodiment, an electric field shielding effect in the electronic assembly can be reinforced. In addition, a breaking phenomenon of the electronic assembly at the step of fabricating the electronic assembly, in particular, in the step of sawing, can be suppressed, and accordingly, a fabrication yield of the electronic assembly can be enhanced. In addition, respective electronic elements constituting the electronic assembly can be easily identified from the outside.

DETAILED DESCRIPTION

Advantages and features of the present disclosure, and a method for achieving the same will be clarified by referring to embodiments described in detail below along with the accompanying drawings. However, the present disclosure is not limited to the exemplary embodiments set forth herein, and may be embodied in many different forms. Rather, the exemplary embodiments are provided so that the present disclosure will be thorough and complete, and will fully convey the scope of the present disclosure to those of ordinary skill in the art, and the present disclosure is defined by the scope of the claims.

Further, in explaining embodiments of the present disclosure, any specific explanation on a well-known related function or configuration deemed to obscure the gist of the present disclosure will be omitted. Also, the terms used herein are defined according to the functions of the embodiments of the present disclosure. Thus, the terms may vary depending on users' or operators' intentions or practices. Therefore, the terms used herein should be understood based on the descriptions made herein.

Figure 1:
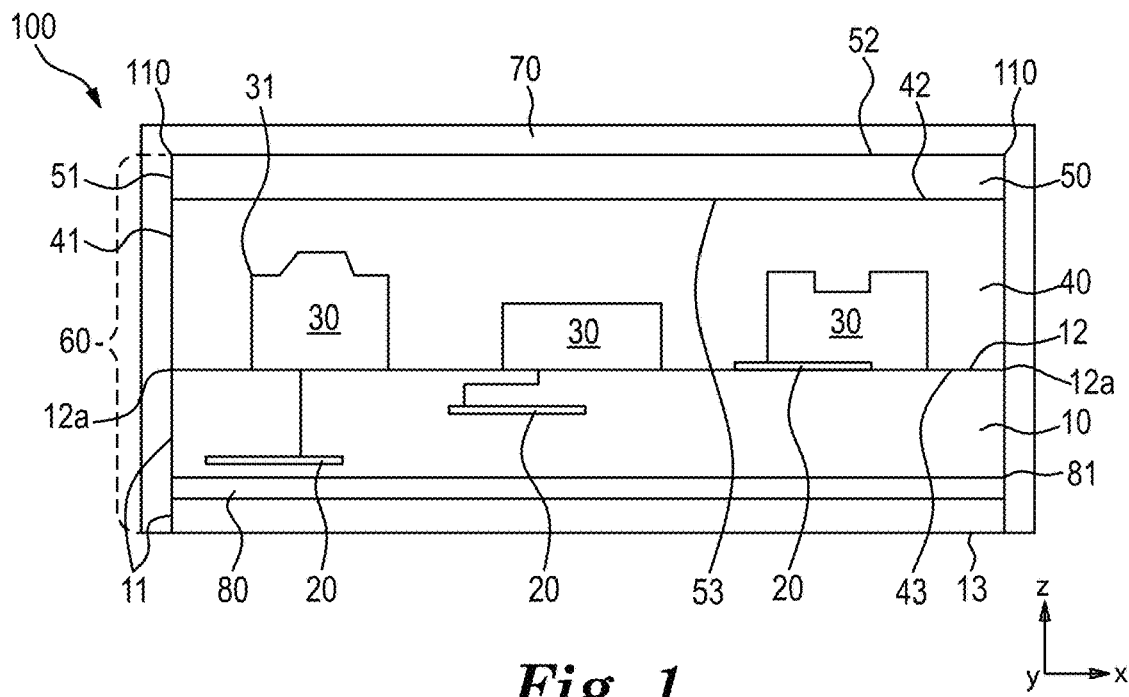
FIG. 1 is a schematic cross-sectional view of an electronic assembly according to an embodiment.
Figure 2:
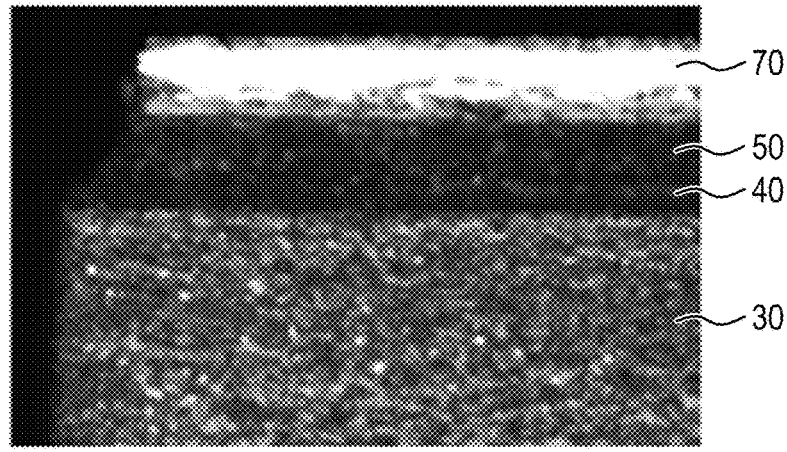
FIG. 2 is a view of a zoomed-in captured image of the cross section of the electronic assembly shown in FIG. 1.

FIG. 1 is a schematic cross-sectional view of an electronic assembly 100 according to an embodiment, and FIG. 2 is a view of a zoomed-in captured image of the cross section of the electronic assembly 100 shown in FIG. 1.

Referring to FIGS. 1 and 2, the electronic assembly 100 includes a circuit board 10, a trace 20, an electronic element 30, a protection layer 40, a magnetic field shielding film 50, and a first metal layer 70 as components. In addition, the electronic assembly 100 may selectively include a ground layer 80 or various components that are not mentioned according to an embodiment. Herein, the cross-sectional view of the electronic assembly 100 shown in FIG. 1 is merely an example.

The circuit board 10 is configured to have various types of components mounted thereon, and may be referred to as a board 10 according to an embodiment. The circuit board 10 may include, for example, a printed circuit board, etc. The circuit board 10 is provided with a main top surface 12 and a main bottom surface 13, and a first edge surface 11 connecting the same. In addition, a lateral edge 12a is provided between the main top surface 12 and the first edge surface 11.

The trace 20 is configured to have an electrical conductivity. At least one trace 20 may be included or disposed inside the circuit board 10 or on the surfaces 11 to 13 of the circuit board 10 described above. The components disposed (or mounted) in the circuit board 10 may exchange signals with one another through the trace 20 included or disposed in the circuit board 10.

The electronic element 30 is designed and configured to perform various functions. For example, the electronic element 30 may include a semiconductor integrated circuit (semiconductor IC), or a complementary metal-oxide semiconductor (CMOS) image sensor, etc.

The electronic element 30 is electrically connected to the trace 20, and is disposed (mounted) on the main top surface 12 of the circuit board 10. In this case, the electronic element 30 is disposed to have a space between a lateral edge 31 thereof and the first edge surface 11 of the circuit board 10, that is, to be spatially spaced apart therefrom. If a plurality of electronic elements 30 are disposed on the main top surface 12 of the circuit board 10, the plurality of electronic elements 30 may be disposed to have a space therebetween, respectively, that is, to be spatially spaced apart from one another.

When it is assumed that the electronic element 30 is disposed on the main top surface 12 of the circuit board 10, the protection layer 40 is disposed on the electronic element 30 to cover the electronic element 30 disposed in this way. Herein, the protection layer 40 'being disposed to cover' the electronic element 30 implies that the protection layer 40 is disposed to surround a part or all of the other surfaces of the electronic element 30 except for a surface contacting the circuit board 10.

The protection layer 40 is provided with a main top surface 42, a main bottom surface 43, and a second edge surface 41 connecting the same. Herein, the main top surface 42 of the protection layer 40 may be substantially planar as shown in FIG. 1.

On the other hand, the main bottom surface 43 of the protection layer 40 may not be substantially planar. Herein, 'not being planar' implies the following case:

where 'the main bottom surface 43 of the protection layer 40 includes a first surface directly contacting the main top surface 12 of the circuit board 10, and a second surface directly contacting the electronic element 30, and the respective heights (heights measured from the main top surface 12 of the circuit board 10) of the first surface and the second surface are different from each other as shown in FIG. 1, and accordingly, the main bottom surface 43 of the protection layer 40 including the first surface and the second surface is not substantially planar.'

The protection layer 40 may include a plurality of silica particles distributed within an epoxy resin.

The magnetic field shielding film 50 is disposed on the protection layer 40, and is configured to block a magnetic field emitted from the electronic element 30 or emitted toward the electronic element 30 from the outside. The magnetic field shielding film 50 is provided with a main top surface 52, a main bottom surface 53, and a third edge surface 51 connecting the same. Hereinafter, electromagnetic characteristics of the magnetic field shielding film 50 will be described.

First, the magnetic field shielding film 50 may have relative permeability within various ranges according to an embodiment. For example, the magnetic field shielding film 50 may have relative permeability which is greater than 2, greater than 10, greater than 50, or greater than 100.

In addition, the magnetic field shielding film 50 may have an electric resistance within various ranges according to an embodiment. For example, the magnetic field shielding film 50 may have an electric resistance which is less than 200 $\mu\Omega$ cm, less than 100 $\mu\Omega$ cm, less than 50 $\mu\Omega$ cm, less than 20 $\mu\Omega$ cm, or less than 10 $\mu\Omega$ cm. Alternatively, the magnetic field shielding film 50 may have an electric resistance which is greater than 1000 $\mu\Omega$ cm according to an embodiment.

A detailed configuration of the magnetic field shielding film 50 will be described in detail in a portion explaining FIGS. 3 and 4.

The first metal layer 70 is configured to block an electric field emitted from the electronic element 30 or emitted toward the electronic element 30 from the outside. The first metal layer 70 may include a conductive ink. Herein, the conductive ink may be configured to include a plurality of materials of each of at least one type of gold, palladium, copper, indium, zinc, titanium, iron, chrome, aluminum, tin, cobalt, platinum, and nickel particles.

The first metal layer 70 is disposed on the magnetic field shielding film 50, and specifically, is configured to cover the main top surface 52 of the magnetic field shielding film 50 and a coupling edge surface 60.

Herein, the 'coupling edge surface 60' refers to a virtual 'surface' which is formed by substantially aligning the first edge surface 11 of the circuit board 10, the second edge surface 41 of the protection layer 40, and the third edge surface 51 of the magnetic field shielding film 50 with one another, and is substantially planar. In this case, the coupling edge surface 60 may be orthogonal to the main top surface 12 of the circuit board 10. In addition, a predetermined regular pattern may be included in the coupling edge surface 60, and the regular pattern will be described in detail in a portion explaining FIGS. 5 to 12.

The ground layer 80 is configured to have an electrical conductivity, and may be inserted into the inside of the circuit board 10.

The ground layer 80 is provided with a lateral edge 81. The lateral edge 81 of the ground layer 80 may physically contact a portion of the first metal layer 70 covering the coupling edge surface 60. Specifically, the first metal layer 70 disposed on the magnetic field shielding film 50 may pass over a later edge 110 of the electronic assembly 100, and may be extended toward the main top surface 12 of the circuit board 10, and may physically contact the lateral edge 81 of the ground layer 80.

Due to the physical contact as described above, the ground layer 80 may serve as a ground to block the electric field or magnetic field in the electronic assembly 100.

In an embodiment, the magnetic field shielding film 50 may be configured in various forms, and accordingly, various effects can be achieved. For example, the magnetic field shielding film 50 may be configured to reinforce the electric field shielding effect in the electronic assembly 100. In addition, the magnetic field shielding film 50 may be configured to suppress a breaking phenomenon of the electronic assembly 100 in a step of fabricating the electronic assembly 100, in particular, in a step of sawing. In addition, the magnetic field shielding film 50 may be configured to be laser-writable. Hereinafter, the configuration of the magnetic field shielding film 50 will be described in detail.

Figure 3:
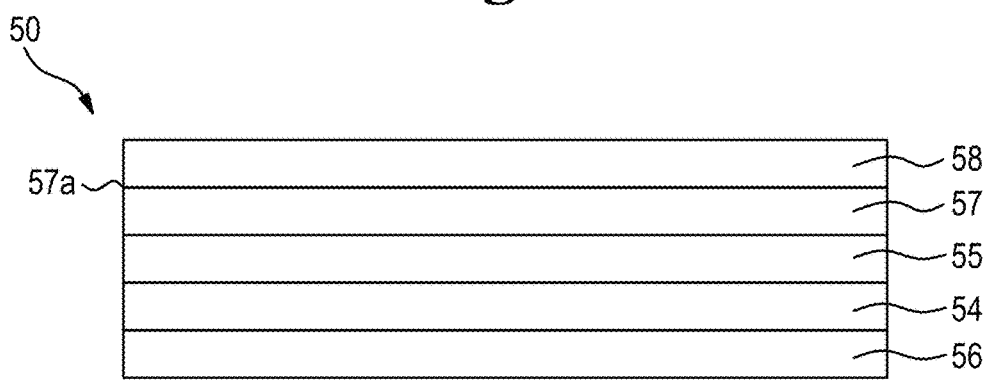
FIG. 3 is a schematic cross-sectional view of a magnetic field shielding film shown in FIG. 1.

FIG. 3 is a schematic cross-sectional view of the magnetic field shielding film 50 according to an embodiment. Referring to FIG. 3, the magnetic field shielding film 50 may include a magnetic field shielding layer 54, and according to an embodiment, may selectively include at least one of a first adhesive layer 55, a second adhesive layer 56, a second metal layer 57, and a third adhesive layer 58. Herein, the cross-sectional view of the magnetic field shielding film 50 shown in FIG. 3 is merely an example, and the components mentioned above as being included in the magnetic field shielding film 50 are also merely examples. Hereinafter, however, a case in which the magnetic field shielding film 50 includes all of the magnetic field shielding layer 54, the first adhesive layer 55, the second adhesive layer 56, the second metal layer 57, and the third adhesive layer 58 will be described.

The magnetic field shielding layer 54 from among the components mentioned as being included in the magnetic field shielding film 50 will be described first. The magnetic field shielding layer 54 may include a material for blocking the magnetic field. For example, the magnetic field shielding layer 54 may include at least one of soft magnetic-conductive ferrite, magnetic-conductive metal, a magnetic-conductive crystalline alloy, a magnetic-conductive nanocrystalline alloy, a magnetic-conductive amorphous alloy, and a magnetic-conductive compound. Hereinafter, each of the materials mentioned above as being included in the magnetic field shielding layer 54 will be described.

The soft magnetic-conductive ferrite may include at least one of manganese-zinc ferrite and nickel-zinc ferrite. In addition, the soft magnetic-conductive ferrite may have a coercive force which is less than 1000 A/m, less than 100 A/m, less than 50 A/m, or less than 20 A/m.

The magnetic-conductive metal may include an alloy including iron. In this case, the alloy including iron may include at least one of silicon, aluminum, boron, niobium, copper, cobalt, nickel, chrome, and molybdenum.

The magnetic-conductive crystalline alloy may include at least two of iron, cobalt, and nickel.

The magnetic-conductive nanocrystalline alloy may include iron, silicon, boron, niobium, and copper.

The magnetic-conductive amorphous alloy may include at least one of cobalt and iron, and along with this, may include at least one of silicon and boron.

The magnetic-conductive compound may include particles which are distributed in a binder. Such particles may include metal particles. In addition, the metal particles may include an iron-aluminum-silicon alloy.

The second metal layer 57 may include copper (Cu). A lateral edge 57a is provided on the second metal layer 57, and in this case, the lateral edge 57a may physically contact the coupling edge surface 60.

Each of the first adhesive layer 55, the second adhesive layer 56, and the third adhesive layer 58 may serve as an adhesive. For example, it is assumed that the protection layer 40, the second adhesive layer 56, the magnetic field shielding layer 54, the first adhesive layer 55, the second metal layer 57, the third adhesive layer 58, and the first metal layer 70 are disposed in sequence as shown in FIGS. 1 and 3. In this case, the second adhesive layer 56 may bond the magnetic field shielding layer 54 and the protection layer 40 to each other, the third adhesive layer 58 may bond the second metal layer 58 and the first metal layer 70 to each other, and the first adhesive layer 55 may bond the second metal layer 57 and the magnetic field shielding layer 54 to each other.

Herein, the first adhesive layer 55 may be substantially opaque from an optical aspect, and the second adhesive layer 54 may be substantially transparent from an optical aspect. In addition, the third adhesive layer 58 may be substantially opaque from an optical aspect, and may be laser-writable, and the third adhesive layer 58 may be referred to as a polymeric layer.

In another embodiment, the magnetic field shielding film 50 may include only the magnetic field shielding layer 54, the first adhesive layer 55, and the second adhesive layer 56, and in this case, the second adhesive layer 56 may bond the magnetic field shielding layer 54 and the protection layer 40 to each other, and the first adhesive layer 55 may bond the first metal layer 70 and the magnetic field shielding layer 54 to each other.

Figure 4:
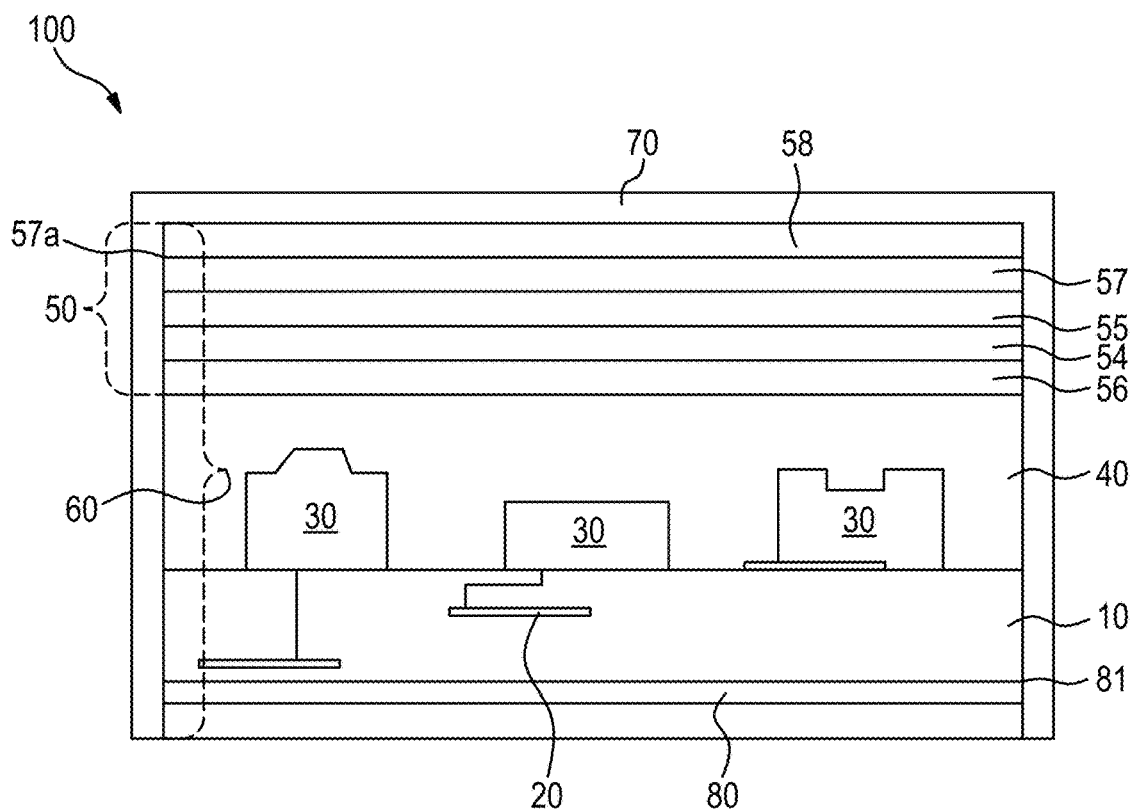
FIG. 4 is a schematic cross-sectional view of the electronic assembly employing the magnetic field shielding film shown in FIG. 3.

FIG. 4 is a schematic cross-sectional view of the electronic assembly 100 including the magnetic field shielding film 50 which has been described up to now. Referring to FIG. 4, the magnetic field shielding film 50 included in the electronic assembly 100 may include the magnetic field shielding layer 54, the first adhesive layer 55, the second adhesive layer 56, the second metal layer 57, and the third adhesive layer 58. In addition, as shown in FIG. 4, the protection layer 40, the magnetic field shielding film 50, the first metal layer 70, and the third adhesive layer 58 may be co-extensive with the circuit board 10 in length and width.

Hereinafter, operations or effects when the electronic assembly 100 is configured as shown in FIG. 4 will be described.

The second metal layer 58 included in the magnetic field shielding film 50 may serve to block the electric field. That is, the electric field shielding effect in the electronic assembly 100 can be reinforced by the second metal layer 58 included in the magnetic field shielding film 50.

In addition, the second metal layer 58 may suppress a breaking phenomenon of the electronic assembly 100 in the step of fabricating the electronic assembly 100, in particular, in the step of sawing. That is, due to the property of metal (ductility or malleability) included in the second metal layer 58, the breaking phenomenon of the electronic assembly 100 can be suppressed. Accordingly, a yield of the electronic assembly 100 can be enhanced, which will be described in more detail in a portion explaining FIGS. 13 to 18.

In addition, the third adhesive layer 58 included in the magnetic field shielding film 50 is configured to be laser-writable. From the outside, the respective electronic elements 30 constituting the electronic assembly 100 can be easily identified through an identifier displayed on the third adhesive layer 58 through laser-writing.

Figure 5:
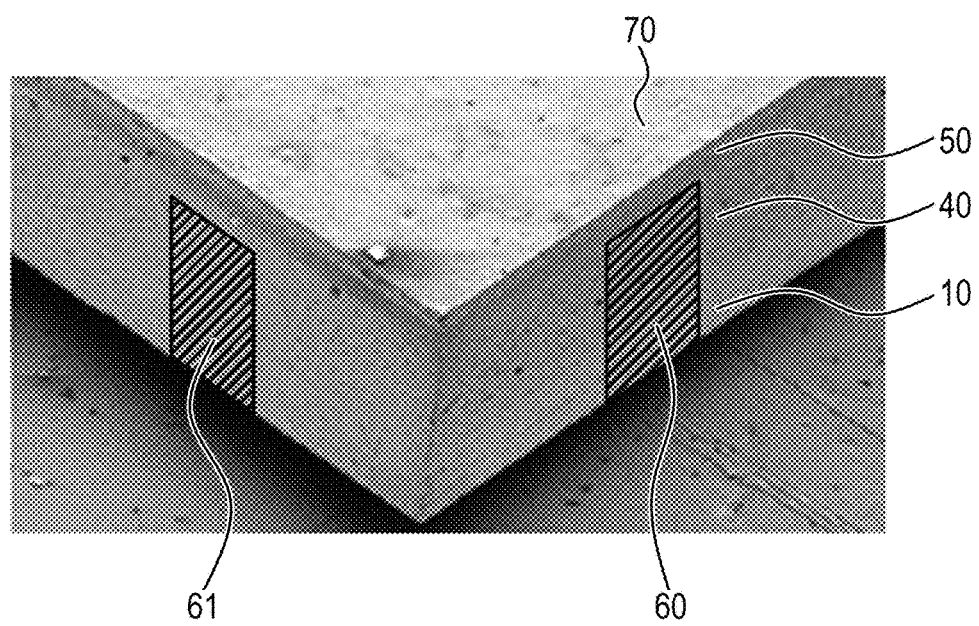
FIG. 5 is a partial perspective view of the electronic assembly illustrating two coupling edge surfaces.

Herein, as described above, the coupling edge surface 60 refers to a virtual 'surface' which is formed by substantially aligning the first edge surface 11 of the circuit board 10, the second edge surface 41 of the protection layer 40, and the third edge surface 51 of the magnetic field shielding film 50 with one another, and which is substantially planar. Herein, if the electronic assembly 100 has a polyhedral shape (for example, a cuboid shape), the coupling edge surface may exist on every side surface of the polyhedral electronic assembly 100 as shown in FIG. 5 (reference numerals 60 and 61). Hereinafter, the coupling edge surface corresponding to reference numeral 60 is referred to as a first coupling edge surface 60, and the coupling edge surface corresponding to reference numeral 61 is referred to as a second coupling edge surface 61. In addition, the first coupling edge surface 60 and the second coupling edge surface 61 will be described hereinafter with reference to FIGS. 6 and 7.

Figure 6:
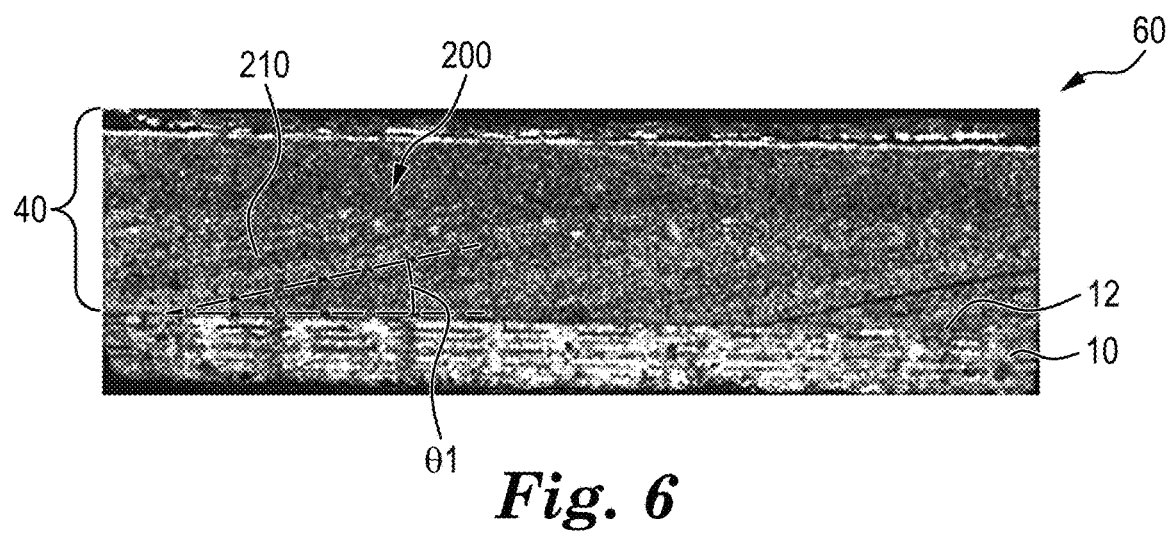
FIG. 6 is a view of an exemplary captured image regarding a portion of the coupling edge surface.

FIG. 6 illustrates a portion of the first coupling edge surface 60. Referring to FIG. 6, the first coupling edge surface 60 may include a first regular pattern 200. Herein, the first regular pattern 200 may include a plurality of first features 210 which form a first angle θ1 with respect to the main top surface 12 of the circuit board 10, and are substantially parallel to one another. In this case, each of the plurality of first features 210 may be a groove. In addition, the first angle θ1 may be less than 45 degrees or less than 30 degrees.

Figure 7:
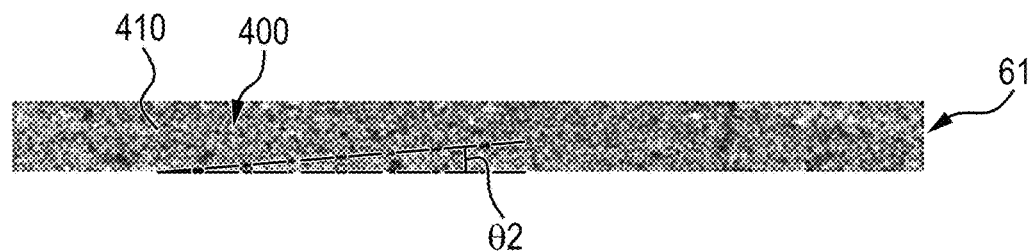
FIG. 7 is a view of an exemplary captured image regarding another portion of the coupling edge surface.

FIG. 7 illustrates a portion of the second coupling edge surface 61. Referring to FIG. 7, the second coupling edge surface 61 may include a second regular pattern 400. Herein, the second regular pattern 400 may include a plurality of second features 410 which form a second angle θ2 with respect to the main top surface 12 of the circuit board 10, and are substantially parallel to one another. In this case, each of the plurality of second features 410 may also be a groove. In addition, the second angle θ2 may have a different value from that of the first angle θ1.

Herein, the Fourier transform of the first regular pattern 200 and the Fourier transform of the second regular pattern 400 may have different characteristics, and this is because the first angle θ1 of the first regular pattern 200 and the second angle θ2 of the second regular pattern 400 are different from each other.

Figure 8:
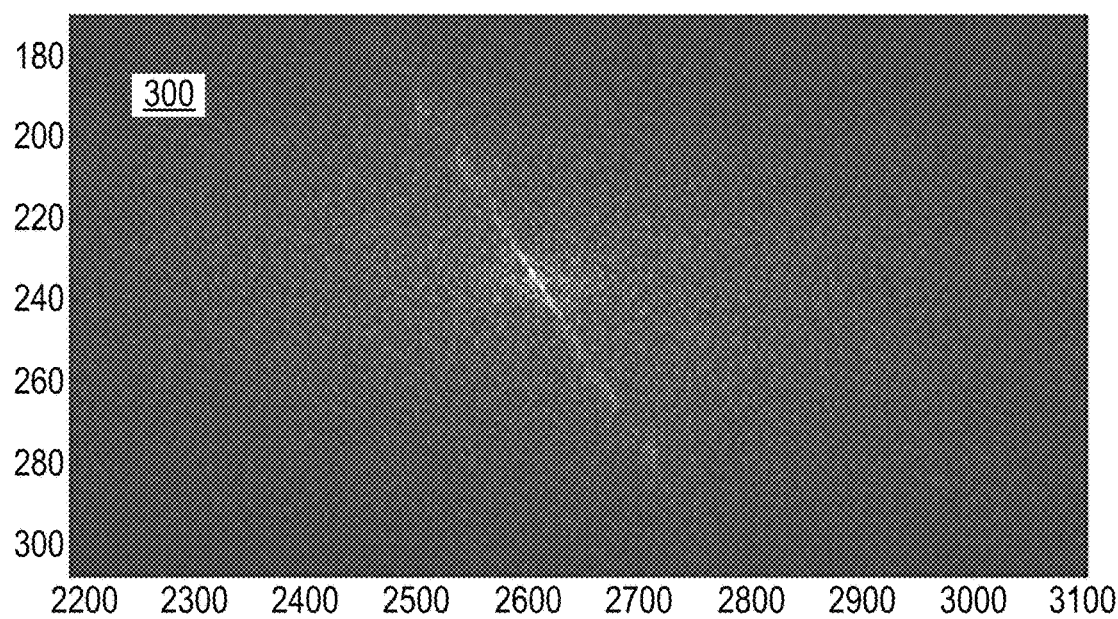
FIG. 8 is a view illustrating a result of Fourier transform of a portion of the coupling edge surface.
Figure 9:
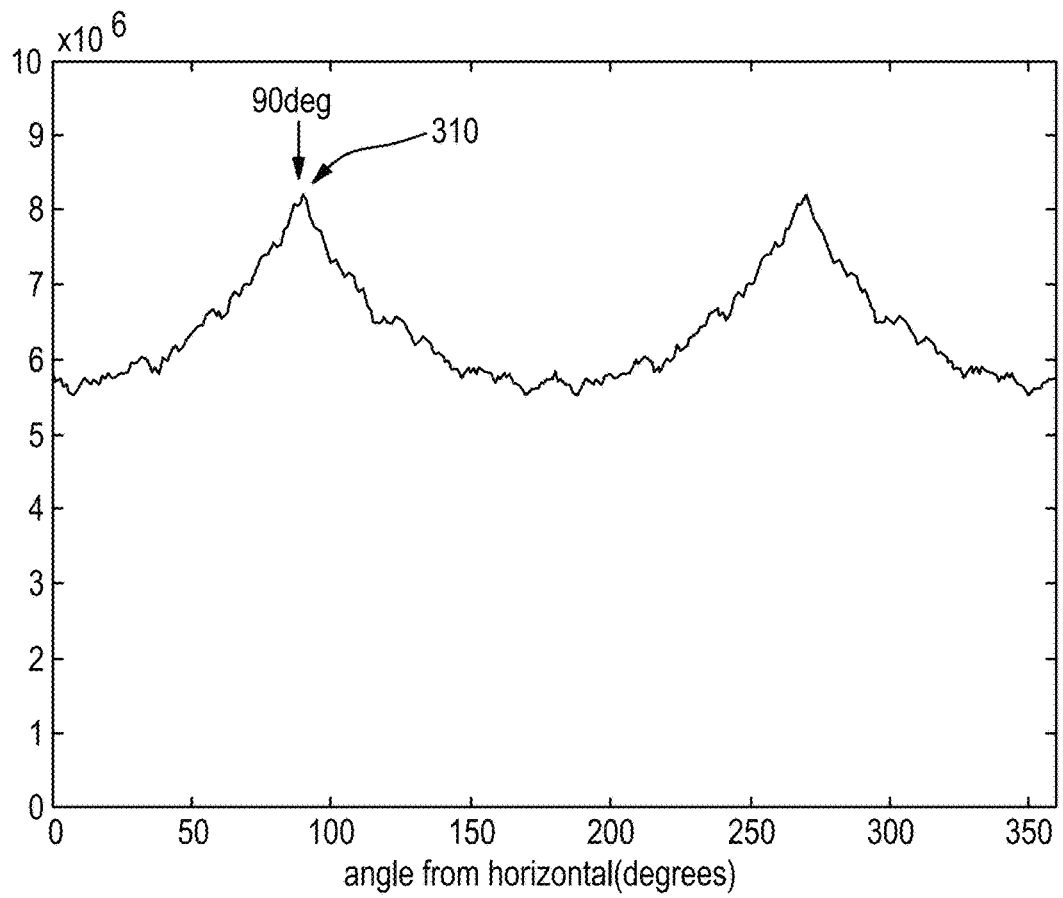
FIG. 9 is a view illustrating a result of additional analysis of the result of the Fourier transform shown in FIG. 8.
Figure 10:
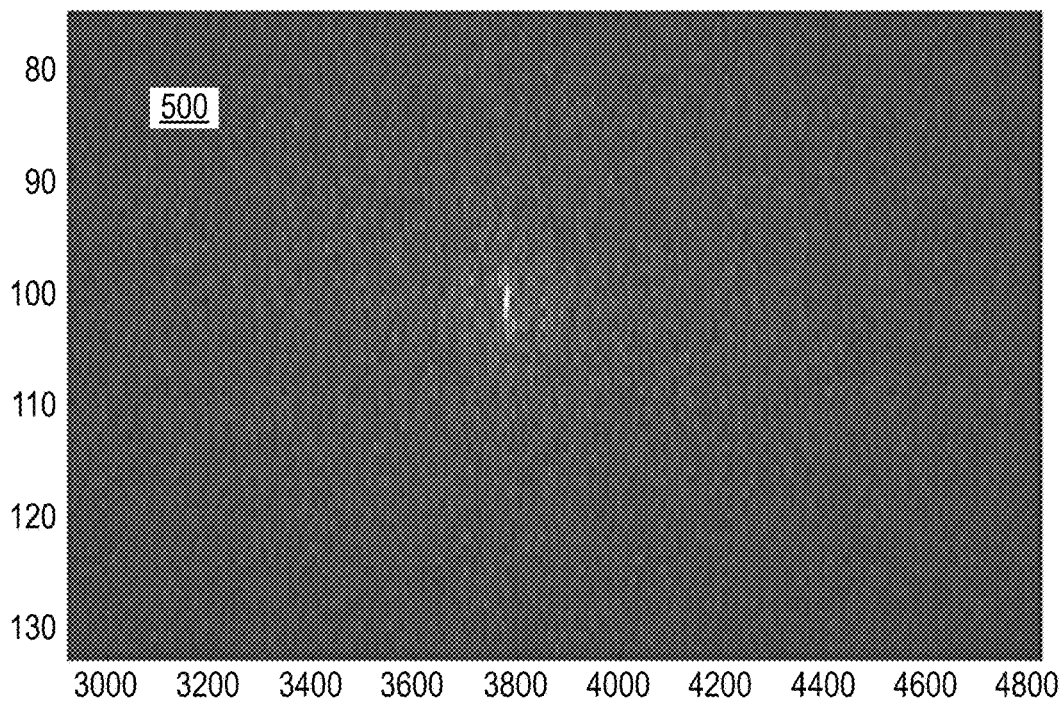
FIG. 10 is a view illustrating a result of Fourier transform of another portion of the coupling edge surface.
Figure 11:
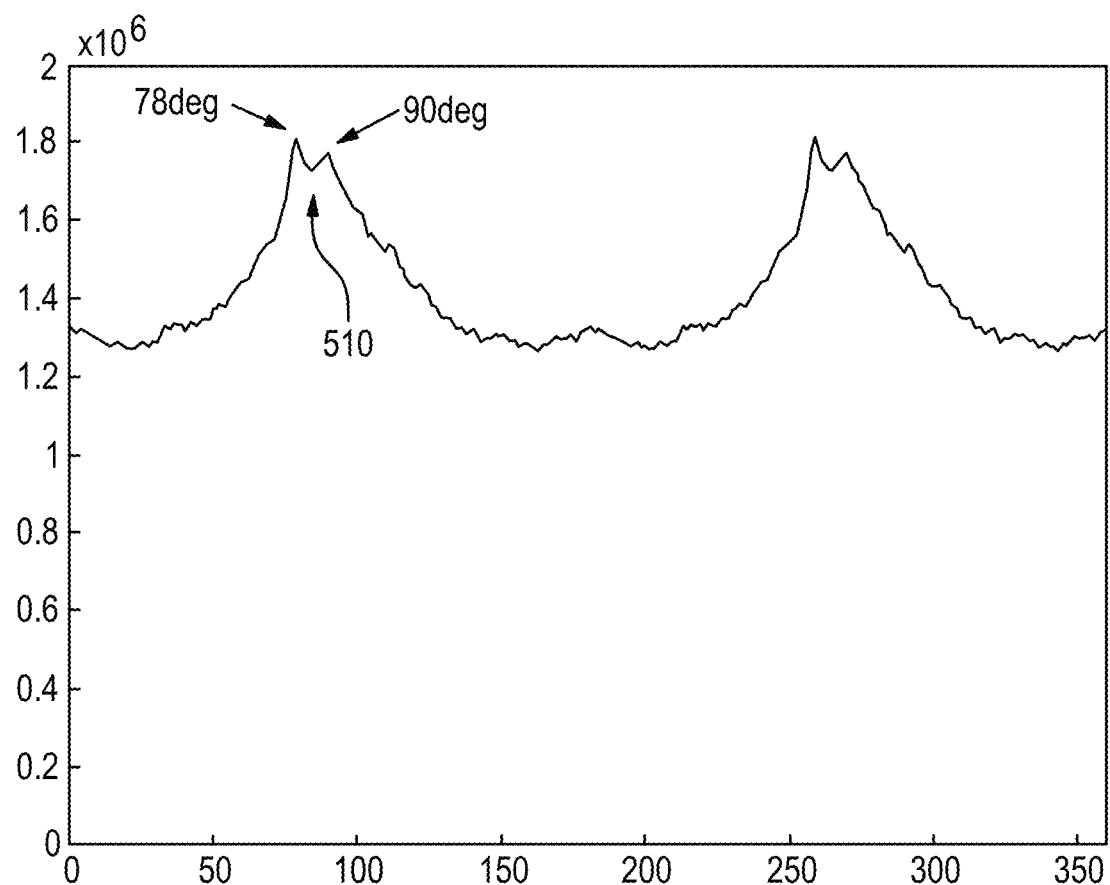
FIG. 11 is a view illustrating a result of additional analysis of the result of the Fourier transform shown in FIG. 10.

Such characteristics of the Fourier transform are illustrated in FIGS. 8 to 11. Specifically, FIGS. 8 and 9 illustrate results of the Fourier transform for the first regular pattern 200, and FIGS. 10 and 11 illustrate results of the Fourier transform for the second regular pattern 400.

Referring to FIGS. 8 to 11, the first regular pattern 200 may have a peak value 310 at a spatial frequency existing within a range from 10 (l/mm) to 30 (l/mm). That is, the first coupling edge surface 60 may include the first regular pattern 200 in which the Fourier transform has the peak value 310.

In addition, the Fourier transform of the second regular pattern 400 may have a peak value 510 at a spatial frequency existing within a different range from that of the first regular pattern 200. That is, the second coupling edge surface 61 may include the second regular pattern 400 in which the Fourier transform has the peak value 510. In this case, the ranges of the spatial frequency having the peak value 510 may be different from each other in the first regular pattern 200 and the second regular pattern 400.

Figure 12:
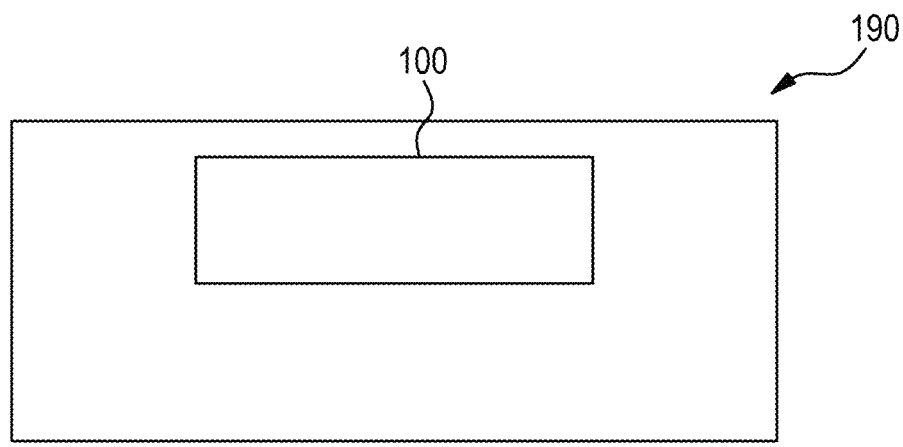
FIG. 12 is a schematic concept view of an electronic apparatus employing the electronic assembly according to an embodiment.

The electronic assembly 100 described up to now may be applied to an electronic apparatus 190 as shown in FIG. 12.

Hereinafter, a process of fabricating the electronic assembly 100 according to an embodiment will be described.

First, when the circuit board 10 is provided and at least two electronic elements 30 are provided, a step (S1) of disposing (mounting) the at least two electronic elements 30 on the main top surface 120 of the circuit board 10, respectively, is performed. The circuit board 10 provided in this way may include the plurality of traces 20 having an electrical conductivity, and the at least two electronic elements 30 described above are electrically connected with at least some of the plurality of traces 40, respectively, and are disposed (mounted) on the main top surface 12 of the board 10.

Figure 13:
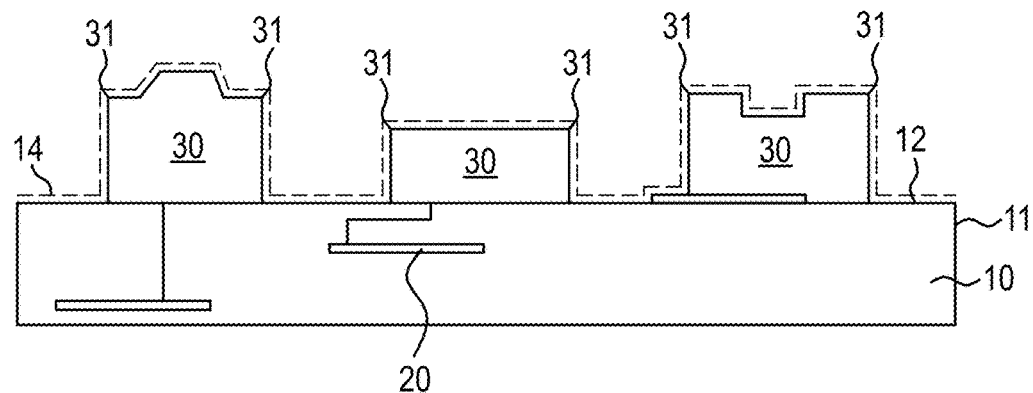
FIGS. 13 to 18 are cross-sectional views of the electronic assembly, respectively, which is obtained in a process of fabricating the electronic assembly according to an embodiment.

FIG. 13 illustrates a cross-sectional view of the state in which the at least two electronic elements 30 are connected with at least some of the plurality of traces 40 and are disposed on the circuit board 10. Referring to FIG. 13, the lateral edge 31 of each of the at least two electronic elements 30 is spatially spaced apart from the first edge surface 11 of the board 10, and is disposed. In addition, the respective electronic elements 30 are spatially spaced apart from one another, and are disposed.

A virtual surface connecting an area of the top surface 12 of the circuit board 10 where the electronic element 12 is not disposed, the lateral edge of the electronic element 12 disposed on the circuit board 10, and a top surfaces of the electronic element 12 is defined as a "structured surface 14." FIG. 13 illustrates the structured surface 14 by a dashed line. Referring to the structured surface 14, heights at respective points existing on the structured surface 14 may be different from one another. For example, a height at a point of the structured surface 140 corresponding to an area where the electronic element 12 is disposed may be different from a height of a point corresponding to an area where the electronic element 12 is not disposed.

Next, after the at least two electronic elements 30 are mounted on the main top surface 12 of the circuit board 10 according to step S1 described above, a step (S2) of additionally disposing the protection layer 40 thereon is performed.

Figure 14:
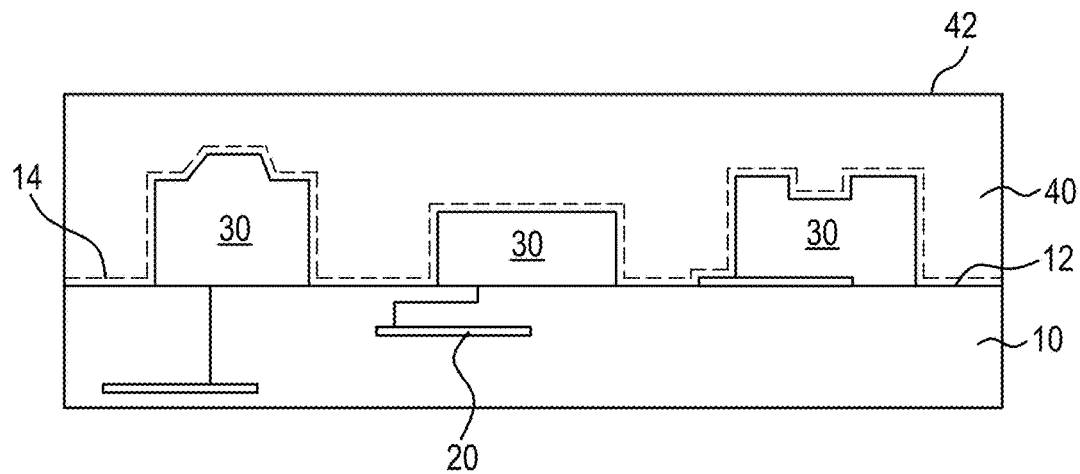

Explaining in more detail based on FIG. 14, the protection layer 40 is disposed to cover the at least two electronic elements 30. Herein, 'being disposed to cover' implies that the protection layer 40 is disposed to surround a part or all of the other surfaces of the electronic element 30 except for a surface contacting the circuit board 10.

Herein, if the main bottom surface 43 of the protection layer 40 is defined as a surface contacting the structured surface 14 described above, the main bottom surface 43 of the protection layer 40 may not be substantially planar. On the other hand, the main top surface 42 of the protection layer 40 may be substantially planar. That is, the protection layer 40 is disposed on the structured surface 14, such that the main top surface 42 of the protection layer 40 that is substantially planar exists above the structured surface 14.

Hereinafter, a specific procedure of disposing the protection layer 40 as shown in FIG. 14 will be described.

First, a step of applying an epoxy resin to the at least two electronic elements 30 is performed. Herein, 'applying the epoxy resin to the electronic element 30' may imply that the epoxy resin is coated over the circuit board 10 on which the electronic elements 30 are disposed, but is not limited thereto.

Next, a step of curing the epoxy resin applied to the at least two electronic elements 30 is performed. In this case, a product of a result of curing the epoxy resin is the protection layer 40. That is, the epoxy resin is cured, and the protection layer 40 whose main top surface 42 is planar and whose main bottom surface 43 is not planar is formed.

Figure 15:
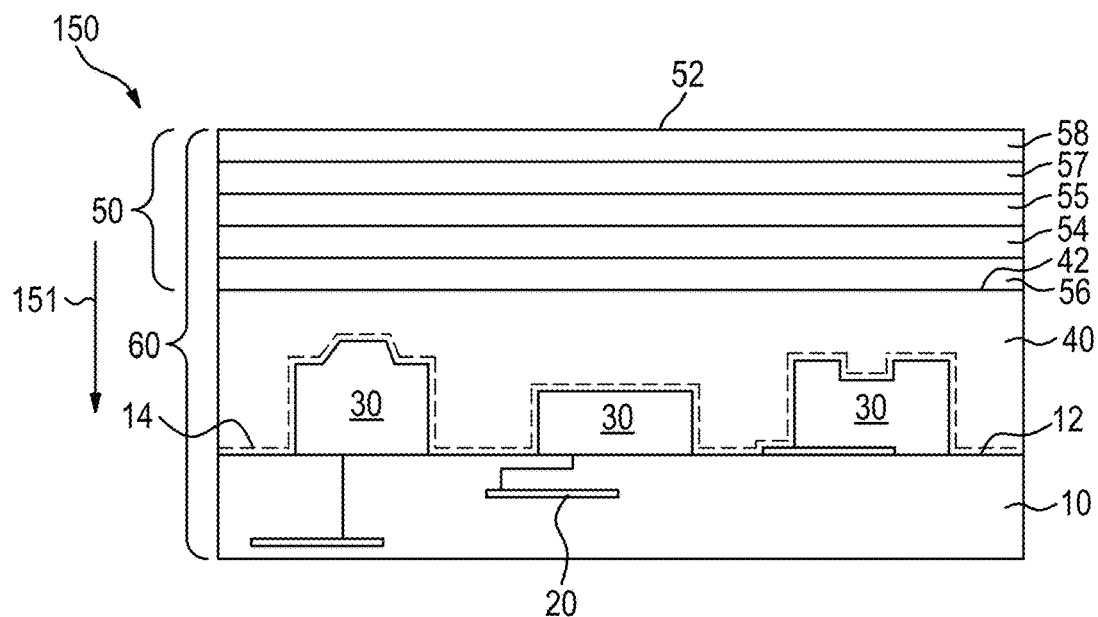

Next, when the protection layer 40 is disposed according to step S2 described above, a step (S3) of disposing the magnetic field shielding film 50 thereon is performed as shown in FIG. 15. In this case, the magnetic field shielding film 50 disposed at step S3 may be configured to include the magnetic field shielding layer 54, the first adhesive layer 55, the second adhesive layer 56, the second metal layer 57, and the third adhesive layer 58 as shown in FIG. 15, and, regarding the components included in the magnetic field shielding film 50, the explanations of FIG. 3 are referenced. In addition, in the process of performing step S3, a laminating process for the magnetic field shielding film 50 may be performed. Hereinafter, an article in which the magnetic field shielding film 50 is disposed according to step S3 is referred to as a 'multilayer article 150.

Next, with respect to the multilayer article 150 produced according to step S3 described above, a step (S4) of fabricating the electronic assembly 100 is performed by disposing the first metal layer 70 on the magnetic field shielding film 50 to cover the main top surface 52 of the magnetic field shielding film 50 and at least a part of the coupling edge surface 60. The cross-sectional view shown in FIG. 4 is related to the electronic assembly 100 fabricated according to step S4 described above.

In this case, in the process of disposing the first metal layer 70 at step S4, at least one of sputtering, physical vapor deposition, chemical vapor deposition, plasma deposition, spin coating, plasma enhanced chemical vapor deposition, electronic beam vapor deposition, thermal evaporation, low pressure chemical vapor deposition, and atomic layer deposition may be used. Alternatively, directly depositing may be used to dispose the first metal layer 70.

According to an embodiment, step S4 may not be performed, and a step of producing a "cut multilayer article" by cutting the above-mentioned multilayer article 150 at step S3 described above may be performed. Hereinafter, this will be described in more detail with reference to FIGS. 15 to 19.

First, a step (S5) of producing at least two cut multilayer articles by cutting the multilayer article 150 shown in FIG. 15 along a predetermined cutting direction is performed. Herein, the cutting direction may be consistent with a thickness direction of the multilayer article 150, and the cutting direction is indicated by reference numeral 151 in FIG. 15.

In this case, the method of cutting the multilayer article 150 may be at least one of saw cutting, laser cutting, etching, diamond cutting, and water-jetting.

Figure 16:
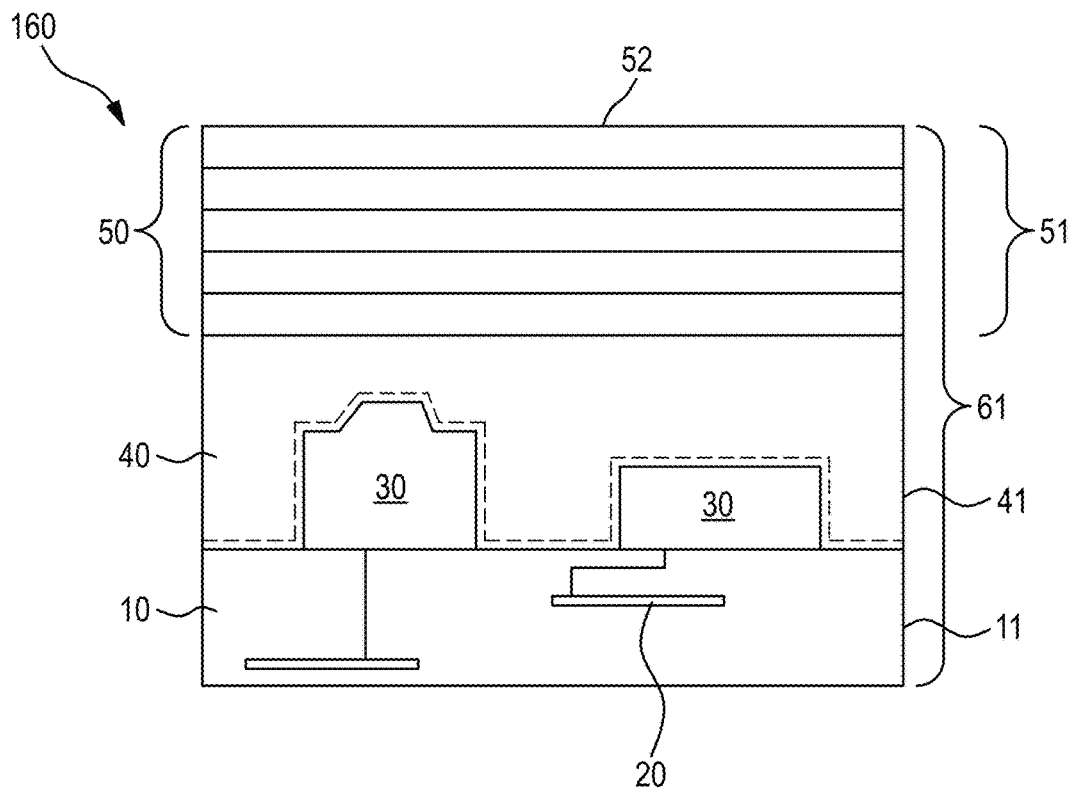
Figure 17:
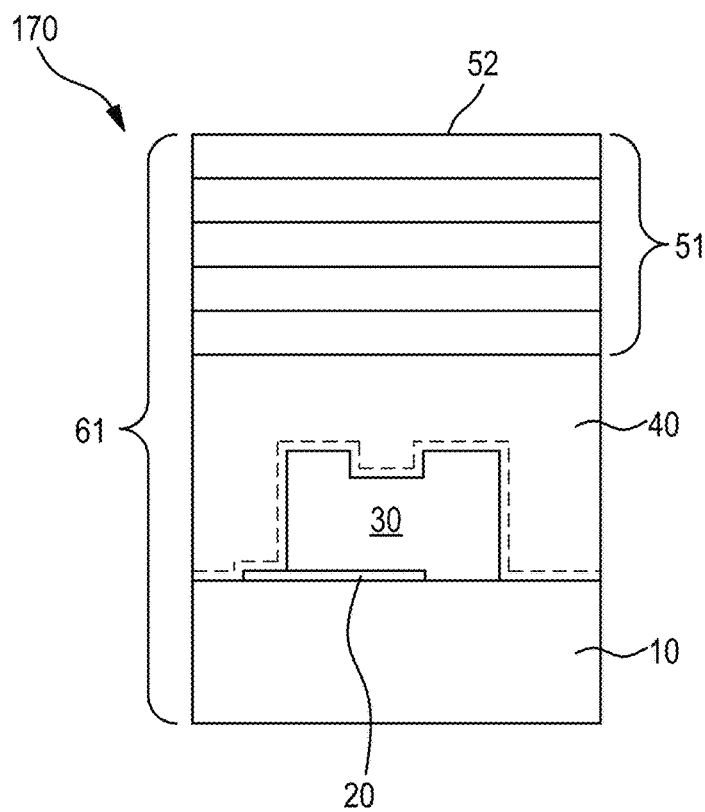

FIGS. 16 and 17 are cross-sectional views illustrating cut multilayer articles 160, 170 produced by cutting the multilayer article 150 according to step S5, respectively. Referring to FIGS. 16 and 17, at least one electronic element 30 may be included in each of the cut multilayer articles 160, 170.

Figure 18:
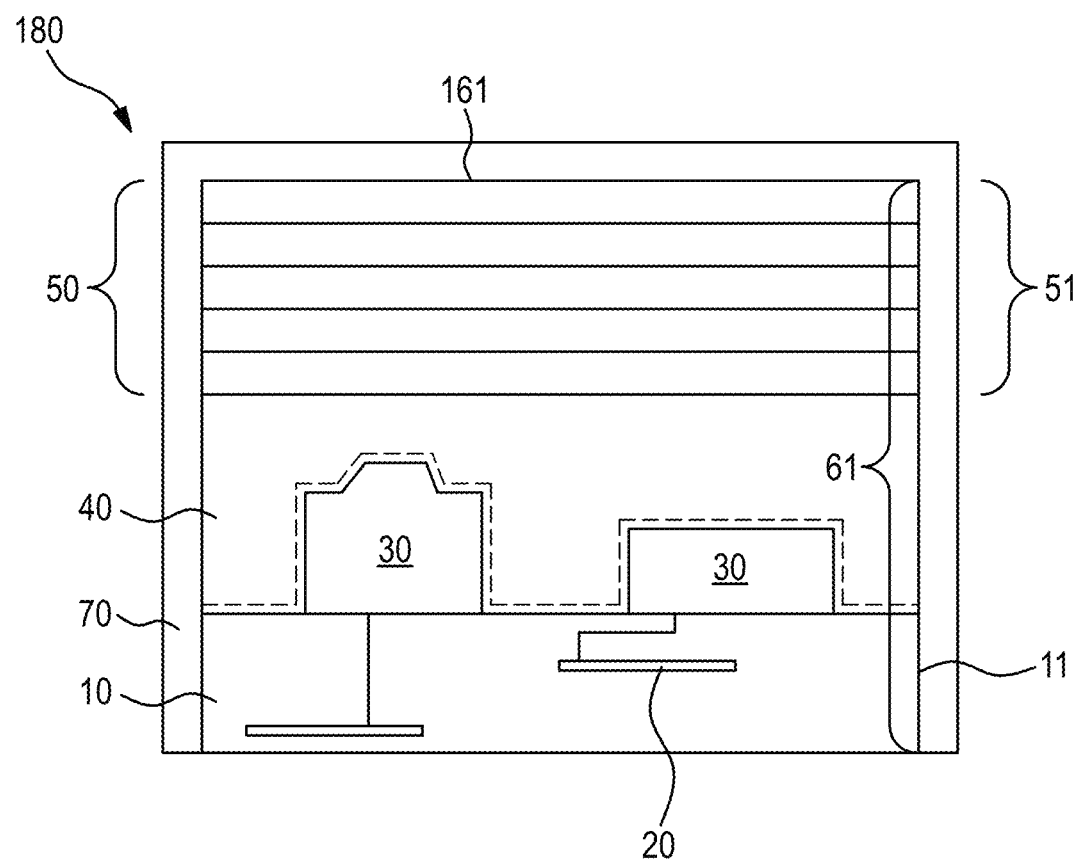

Next, a step (S6) of fabricating an electronic assembly by disposing the first metal layer 70 on the main top surface 52 and a cut multilayer edge surface 61 of the cut multilayer article is performed with respect to at least one of the cut multilayer articles 160, 170. FIG. 18 illustrates a cross-sectional view of the electronic assembly 180 fabricated according to step S6. Herein, the cut multilayer edge surface 61 refers to a virtual 'surface' which is formed of the first edge surface 11 of the circuit board 10, the second edge surface 41 of the protection layer 40, and the third edge surface 51 of the magnetic field shielding film 50, and for example, is formed by substantially aligning these edge surfaces 11, 41, 51 with one another.

Regarding the electronic assembly 100 fabricated by the above-described fabrication method and the respective components included in the electronic assembly 100, the above-described explanations are referenced.

Hereinafter, embodiments of another aspect of the present disclosure will be described.

An electronic assembly 100 according to embodiments of another aspect of the present disclosure will be described with reference to FIGS. 1 to 4, but is different from that shown in FIGS. 1 to 4 in that the protection layer 40 is not included in the electronic assembly 100.

Explaining the electronic assembly 100 of another aspect with reference to FIGS. 1 to 4, the electronic assembly 100 includes a board 10, a plurality of semiconductor integrated circuits 30, a nanocrystalline soft magnetic film 50, and a first metal edge surface 70. According to the situation, the electronic assembly 100 may further include a second metal edge surface (not shown in FIG. 1). However, the components mentioned above as being included in the electronic assembly 100 are merely examples.

The board 10 is configured to have various types of components mounted thereon. The board 10 may include, for example, a printed circuit board, etc. The board 10 is provided with a main top surface 12 and a main bottom surface 13, and an edge surface 11 connecting the same.

The semiconductor integrated circuit 30 is an example of the electronic element 30 mentioned in the above-described one embodiment. A plurality of semiconductor integrated circuits 30 may be mounted (disposed) on the main top surface 12 of the board 10.

The nanocrystalline soft magnetic film 50 is disposed on the board 10 on which the semiconductor integrated circuits 30 are mounted, and is configured to block a magnetic field emitted from the semiconductor integrated circuits 30 or emitted toward the semiconductor integrated circuits 30 from the outside. The nanocrystalline soft magnetic film 50 is provided with a main top surface 52, a main bottom surface 53, and an edge surface 51 connecting the same.

The first metal edge surface 70 is disposed to connect the main top surface 52 of the nanocrystalline soft magnetic film 50 and the main bottom surface 13 of the electronic assembly 100. A more detailed explanation is provided. The first metal edge surface 70 may substantially cover the entire edge surfaces 11, 51 of the electronic assembly 100, and in this case, may physically contact the edge surface 11 of the board 10 and the edge surface 51 of the nanocrystalline soft magnetic film 50, respectively. Herein, 'covering' refers to the first metal edge surface 70 surrounding the edge surfaces 11, 51 of the electronic assembly 100 not to expose the edge surfaces 11, 51 of the electronic assembly 100 to the outside.

In addition, the first metal edge surface 70 is configured to be substantially planar.

In addition, the first metal edge surface 70 may include a conductive ink including a plurality of materials of at least one of silver, gold, palladium, copper, indium, zinc, titanium, iron, chrome, aluminum, tin, cobalt, platinum, and nickel particles.

In addition, the first metal edge surface 70 includes a first regular pattern 200 including first features 210 which are substantially parallel to one another. Herein, each of the first features 210 may be a groove. In addition, the first features 210 which are substantially parallel to one another may form a first angle $\theta 1$ with respect to the main top surface 12 of the board 10, and the first angle $\theta 1$ may be less than 45 degrees or less than 30 degrees, but is not limited thereto.

In the case of the first regular pattern 200 of the first metal edge surface 70, the Fourier transform may have a peak value. For example, the Fourier transform of the first regular pattern 200 may have a peak value at a spatial frequency within a range from 10 (l/mm) to 30 (l/mm).

The second metal edge surface is disposed to connect the main top surface 52 of the nanocrystalline soft magnetic film 50 and the main bottom surface 13 of the electronic assembly 100. A more detailed explanation is provided. The second metal edge surface may substantially cover the entire edge surfaces 11, 51 of the electronic assembly 100, and in this case, may physically contact the edge surface 11 of the board 10 and the edge surface 51 of the nanocrystalline soft magnetic film 50, respectively. Herein, 'covering' refers to the second metal edge surface surrounding the edge surfaces 11, 51 of the electronic assembly 100 not to expose the edge surfaces 11, 51 of the electronic assembly 100 to the outside.

In addition, the second metal edge surface is configured to be substantially planar.

In addition, the second metal edge surface may include a conductive ink including a plurality of materials of at least one of silver, gold, palladium, copper, indium, zinc, titanium, iron, chrome, aluminum, tin, cobalt, platinum, and nickel particles.

In addition, the second metal edge surface may include a second regular pattern 400 including second features 410 which are substantially parallel to one another. Herein, each of the second features 410 may be a groove. In addition, the second features 410 which are substantially parallel to one another may form a second angle θ2 which is different from the first angle θ1 with respect to the main top surface 12 of the board 10.

In the case of the second regular pattern 400, the Fourier transform may have a peak value. For example, the Fourier transform of the second regular pattern 400 may have a peak value at a spatial frequency existing within a different range from that of the first regular pattern 200.

The board 10 may include a ground layer 80 having an electrical conductivity. In this case, a portion of the first metal edge surface 70 may physically contact a lateral edge 81 of the ground layer 80. Due to the physical contact as described above, the ground layer 80 may serve as a ground to block the electric field or magnetic field in the electronic assembly 100.

Hereinafter, operations or effects when the electronic assembly 100 is configured as described above will be described.

The nanocrystalline soft magnetic film 50 may serve to block the magnetic field. In addition, the first metal edge surface 70 may serve to block the electric field.

The matters mentioned for the respective components of the electronic assembly 100 according to the above-described one embodiment may be applied to the respective components of the electronic assembly 100 according to embodiments of another aspect. For example, the matters mentioned for the circuit board 10, the magnetic field shielding film 50, the electronic element 30, and the first metal layer 70 of the electronic assembly 100 according to the above-described one embodiment may be applied to the board 10, the nanocrystalline soft magnetic film 50, the semiconductor integrated circuit 30, and the first metal edge surface 70 of the electronic assembly 100 included in embodiments of another aspect, respectively.

An electronic assembly 100 according to embodiments of still another aspect of the present disclosure will be described with reference to FIGS. 1 to 4, but is different from that shown in FIGS. 1 to 4 in that the protection layer 40 is not included in the electronic assembly 100 of still another aspect.

Explaining the electronic assembly 100 of still another aspect with reference to FIGS. 1 to 4, the electronic assembly 100 includes a board 10, a plurality of semiconductor integrated circuits 30, a magnetic field shielding layer 54, and a first metal film 70. According to the situation, the electronic assembly 100 may further include a second metal film 57. However, the components mentioned above as being included in the electronic assembly 100 are merely examples.

The board 10 is configured to have various types of components mounted thereon. The board 10 may include, for example, a printed circuit board, etc. The board 10 is provided with a first main surface 12 and a main bottom surface 13, and a first edge surface 11 connecting the same.

The semiconductor integrated circuit 30 is an example of the electronic element 30 mentioned in the above-described one embodiment. A plurality of semiconductor integrated circuits 30 may be disposed (mounted) on the first main surface 12 of the board 10.

The magnetic field shielding layer 54 is disposed on the board 10 on which the plurality of semiconductor integrated circuits 30 are mounted, and is configured to block the magnetic field emitted from the semiconductor integrated circuits 30, respectively, or emitted toward the semiconductor integrated circuits 30 from the outside. That is, the magnetic field shielding layer 54 is configured to cover the plurality of integrated circuits 30. In addition, the magnetic field shielding layer 54 may be configured to cover the entire first main surface 12 of the board 10. Herein, 'covering' refers to the magnetic field shielding layer 54 surrounding an object to be covered not to expose a surface of the object to be covered to the outside. The magnetic field shielding layer 54 is provided with a main top surface 52, a main bottom surface 53, and an edge surface 51 connecting the same.

The first metal film 70 is configured to block the electric field emitted from the semiconductor integrated circuits 30, respectively, or emitted toward the semiconductor integrated circuits 30 from the outside. The first metal film 70 may include a conductive ink including a plurality of materials of at least one of silver, gold, palladium, copper, indium, zinc, titanium, iron, chrome, aluminum, tin, cobalt, platinum, and nickel particles.

The first metal film 70 is disposed on the magnetic field shielding layer 54. That is, when the magnetic field shielding layer 54 is disposed on the plurality of integrated circuits 30 as described above, the first metal film 70 is disposed on the magnetic field shielding layer 54. Hereinafter, a disposition of the first metal film 70 will be described in more detail.

First, the first metal film 70 is disposed on the plurality of semiconductor integrated circuits 30 to cover the plurality of semiconductor integrated circuits 30 at least partially. According to an embodiment, the first metal film 70 may be disposed to substantially cover the entire first main surface 12 of the board 10. That is, the first metal film 70 may be disposed to surround the surfaces of the plurality of semiconductor integrated circuits 30 or the entire first main surface 12 of the board 10 not to expose to the outside.

In addition, the first metal film 70 is disposed to partially cover the plurality of semiconductor integrated circuits 30 and to physically contact lateral edges of the first main surface 12 of the board 10. In addition, the first metal film 70 may be disposed to physically contact lateral edges of respective layers disposed between the first metal film 70 and the first main surface 12 of the board 10.

In addition, when a ground layer 80 having an electrical conductivity is included inside the board 10, the first metal film 70 may be disposed to physically contact a lateral edge 81 of the ground layer 80.

The second metal film 57 may be disposed between the first metal film 70 and the magnetic field shielding layer 54. Herein, since the plurality of integrated circuits 30 are disposed under the magnetic field shielding layer 54, the second metal film 57 may be referred to as being disposed between the first metal film 50 and the plurality of integrated circuits 30.

In addition, the second metal film 57 may be disposed to substantially cover the entire first main surface 12 of the board 10. That is, the second metal film 57 may be disposed to surround the surfaces of the plurality of semiconductor integrated circuits 30 or the entire first main surface 12 of the board 10 not to expose to the outside.

In addition, a lateral edge 57a of the second metal film 57 may physically contact a portion of the first metal film 70.

Hereinafter, operations or effects when the electronic assembly is configured according to embodiments of still another aspect will be described.

The magnetic field shielding layer 54 may serve to block the magnetic field. The first metal film 70 may serve to block the electric field. In this case, the second metal film 57 may also serve to block the electric field along with the first metal film 70. That is, when the electronic assembly 100 includes the second metal film 57, the electric field shielding effect can be reinforced.

In addition, due to the property of metal (ductility or malleability) of the second metal film 57, a breaking phenomenon of the electronic assembly 100 can be suppressed. Accordingly, a yield of the electronic assembly 100 can be enhanced.

The matters mentioned for the respective components of the electronic assembly 100 according to the above-described one embodiment may be applied to the respective components of the electronic assembly 100. For example, the matters mentioned for the circuit board 10, the magnetic field shielding film 50, the electronic element 30, and the first metal layer 70 of the electronic assembly 100 according to the above-described one embodiment may be applied to the board 10, the magnetic field shielding layer 54, the semiconductor integrated circuit 30, and the first metal film 70 of the electronic assembly 100, respectively.

The above-described embodiments are merely examples of the technical concept of the present disclosure, and various modifications and changes can be made by a person skilled in the art without departing from the essential quality of the present disclosure. Therefore, the embodiments disclosed in the present disclosure are not intended to limit the technical concept of the present disclosure, and are just to describe the technical concept of the present disclosure, and the scope of the technical concept of the present disclosure is not limited by the embodiments. The scope of the present disclosure should be defined by the claims presented below, and all technical concepts within the equivalent scope thereto should be construed as being included in the scope of the present disclosure.

DESCRIPTION OF REFERENCE NUMERALS

100: electronic assembly
10: circuit board
30: electronic element
40: protection layer
50: magnetic field shielding film

What is claimed is:

1. A method for fabricating an electronic assembly, the method comprising:
   providing a board comprising a plurality of traces having an electrical conductivity, and at least two spatially spaced semiconductor integrated circuits which are mounted on a first main surface of the board and are electrically connected with the plurality of traces;
   disposing a protection layer on the at least two spatially spaced integrated circuits;
   forming a multilayer article by disposing a magnetic field shielding film on a main top surface of the protection layer, the magnetic field shielding film being a multilayer film comprising a magnetic field shielding layer disposed between first and second adhesive layers, each of the first and second adhesive layers being configured to bond the magnetic field shielding layer to a layer adjacent to the magnetic field shielding layer;
   producing at least two cut multilayer articles by cutting the multilayer article along a thickness direction of the multilayer article at a predetermined cutting point between the at least two spatially spaced integrated circuits, each of the cut multilayer articles comprising a cut multilayer edge surface comprising exposed edges of the board, the protection layer, and the magnetic field shielding film at the predetermined cutting point; and
   with respect to at least one of the cut multilayer articles, fabricating the electronic assembly by disposing a first metal layer at least on a main top surface and the cut multilayer edge surface of the at least one cut multilayer article.

2. The method of claim 1, wherein the disposing the protection layer on the at least two spatially spaced integrated circuits comprises:
   applying an epoxy resin to the at least two spatially spaced integrated circuits; and
   curing the applied epoxy resin, and
   wherein the epoxy resin cured by the curing comprises the main top surface of the protection layer which is substantially planar.

3. The method of claim 1, wherein the forming the multilayer article by disposing the magnetic field shielding film on the main top surface of the protection layer comprises laminating the magnetic field shielding film disposed on the main top surface of the protection layer.

4. The method of claim 1,
   wherein the fabricating the electronic assembly comprises disposing the first metal layer at least on the main top surface and the cut multilayer edge surface of the at least one cut multilayer article by using at least one of sputtering, physical vapor deposition, chemical vapor deposition, plasma deposition, spin coating, plasma enhanced chemical vapor deposition, electronic beam vapor deposition, thermal evaporation, low pressure chemical vapor deposition, and atomic layer deposition.

5. The method of claim 4, wherein the multilayer film further comprises a second metal layer disposed on the first adhesive layer, and a third adhesive layer disposed on the second metal layer to bond the second metal layer to an adjacent layer.

6. The method of claim 5, wherein the third adhesive layer is substantially opaque from an optical aspect.

7. The method of claim 1, wherein the magnetic field shielding film comprises at least one of soft magnetic-conductive ferrite, magnetic-conductive metal, a magnetic-conductive crystalline alloy, a magnetic-conductive nanocrystalline alloy, a magnetic-conductive amorphous alloy, and a magnetic-conductive compound.

8. The method of claim 1, wherein the magnetic field shielding film has a relative permeability which is greater than 50.

9. The method of claim 1, wherein the magnetic field shielding film has an electric resistance which is less than 100 $\mu\Omega$ cm, and is conductive.

10. The method of claim 1, wherein the magnetic field shielding film has an electric resistance which is greater than 1000 $\mu\Omega$ cm, and is electrically insulative.

11. The method of claim 1, wherein the protection layer comprises a plurality of silicon particles which are distributed in an epoxy resin.

12. The method of claim 1, wherein the first metal layer comprises a conductive ink comprising a plurality of materials of at least one of silver, gold, palladium, copper, indium, zinc, titanium, iron, chrome, aluminum, tin, cobalt, platinum, and nickel particles.

13. The method of claim 1, wherein the cut multilayer edge surface comprises a regular pattern, and wherein the regular pattern comprises a plurality of features which form a first angle with respect to the first main top surface of the board, and are substantially parallel to one another.

14. The method of claim 13, wherein at least one feature of the plurality of features which are substantially parallel to one another is a groove.

15. The method of claim 13, wherein the first angle is less than 45 degrees.

16. The method of claim 13, wherein Fourier transform of the regular pattern has a peak value at a spatial frequency existing within a range from 10(1/mm) to 30(1/mm).

17. The method of claim 1, wherein the cut multilayer edge surface comprises a pattern in which Fourier transform has a peak value.

18. The method of claim 1, wherein the board comprises a ground layer disposed therein and having an electrical conductivity, wherein the cut multilayer edge surface comprises an edge surface of the ground layer, and wherein a portion of the first metal layer disposed on the cut multilayer edge surface physically contacts the edge surface of the ground layer.

19. The method of claim 1 further comprising disposing a layer which is substantially opaque from an optical aspect between the first metal layer and the protection layer, wherein, the opaque layer is directly adjacent to the first metal layer, and is laser-writable.

20. A method for fabricating an electronic assembly, the method comprising:
provproviding a board comprising a plurality of traces having an electrical conductivity, and at least two spatially spaced semiconductor integrated circuits which are mounted on a first main surface of the board and are electrically connected with the plurality of traces;
disposing a protection layer on the at least two spatially spaced integrated circuits;
forming a multilayer article by disposing a magnetic field shielding film on a main top surface of the protection layer, the magnetic field shielding film being a multilayer film comprising a magnetic field shielding layer disposed between first and second adhesive layers;
producing at least two cut multilayer articles by cutting the multilayer article along a thickness direction of the multilayer article at a predetermined cutting point between the at least two spatially spaced integrated circuits, each of the cut multilayer articles comprising a cut multilayer edge surface comprising exposed edges of the board, the protection layer, and the magnetic field shielding film at the predetermined cutting point;
with respect to at least one of the cut multilayer articles, fabricating the electronic assembly by disposing a first metal layer at least on a main top surface and the cut multilayer edge surface of the at least one cut multilayer article; and
disposing a layer which is substantially opaque from an optical aspect between the first metal layer and the protection layer, the opaque layer being laser-writable.

* * * * *